US012575436B2

(12) United States Patent
Huang et al.

(10) Patent No.: US 12,575,436 B2
(45) Date of Patent: Mar. 10, 2026

(54) SEMICONDUCTOR DEVICE WITH PROTECTIVE STRUCTURE AND METHOD OF MANUFACTURING THE SAME

(71) Applicant: Taiwan Semiconductor Manufacturing Company, Ltd., Hsinchu (TW)

(72) Inventors: Li-Hsien Huang, Zhubei (TW); Jun He, Zhubei (TW); Yinlung Lu, Hsinchu (TW); Yao-Chun Chuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 384 days.

(21) Appl. No.: 18/142,888

(22) Filed: May 3, 2023

(65) Prior Publication Data

US 2024/0371780 A1     Nov. 7, 2024

(51) Int. Cl.
H01L 23/538 (2006.01)
H01L 21/56 (2006.01)
H01L 23/00 (2006.01)
H01L 23/31 (2006.01)
H01L 25/065 (2023.01)

(52) U.S. Cl.
CPC .......... H01L 23/5386 (2013.01); H01L 21/56 (2013.01); H01L 23/3178 (2013.01); H01L 24/08 (2013.01); H01L 24/80 (2013.01); H01L 25/0652 (2013.01); H01L 2224/08147 (2013.01); H01L 2224/80895 (2013.01); H01L 2924/3512 (2013.01)

(58) Field of Classification Search
CPC ........... H01L 21/56; H01L 2224/08147; H01L 2224/80895; H01L 2225/06513; H01L 23/3178; H01L 23/5385; H01L 23/5386; H01L 23/562; H01L 23/585; H01L 24/08; H01L 24/16; H01L 24/80; H01L 25/0652; H01L 25/0655; H01L 25/18; H01L 25/50; H01L 2924/3512
See application file for complete search history.

(56) References Cited

U.S. PATENT DOCUMENTS

| | | | | |
|---|---|---|---|---|
| 10,763,239 | B2 * | 9/2020 | Chen ........................ | H01L 24/19 |
| 2019/0131273 | A1 * | 5/2019 | Chen ........................ | H01L 24/92 |
| 2024/0120315 | A1 * | 4/2024 | Chen .................... | H01L 23/3185 |

FOREIGN PATENT DOCUMENTS

CN          109727964 A  *  5/2019  ............. H01L 24/92

* cited by examiner

*Primary Examiner* — Telly D Green
(74) *Attorney, Agent, or Firm* — Lippes Mathias LLP

(57) ABSTRACT

A semiconductor device with a multi-tier construction includes a first tier having a first die, a second die spaced apart from the first die in a first direction and a fill material therebetween. A second tier overlays the first tier, and includes a bridge die partially overlaying the fill material and the first and second dies. The bridge die provides an electrical interconnection between the first and second dies in the first tier. The device also has a first protective structure aligned with a first interface between an end of the first die and the fill material that includes a first part formed on a first side of the first die at the end of the first die; and a second part formed on a first side of the bridge die. The first and second parts are aligned and form the first protective structure, mitigating cracking near the bridge die.

20 Claims, 4 Drawing Sheets

SEMICONDUCTOR DEVICE WITH PROTECTIVE STRUCTURE AND METHOD OF MANUFACTURING THE SAME

BACKGROUND

The following relates to the semiconductor arts, and in particular, to multi-tier semiconductor die constructions, for example, such as a system on integrated chip (SoIC), and manufacturing processes and/or methods therefor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompanying figures may be arbitrarily increased or reduced for clarity of discussion.

DETAILED DESCRIPTION

Figure 1:
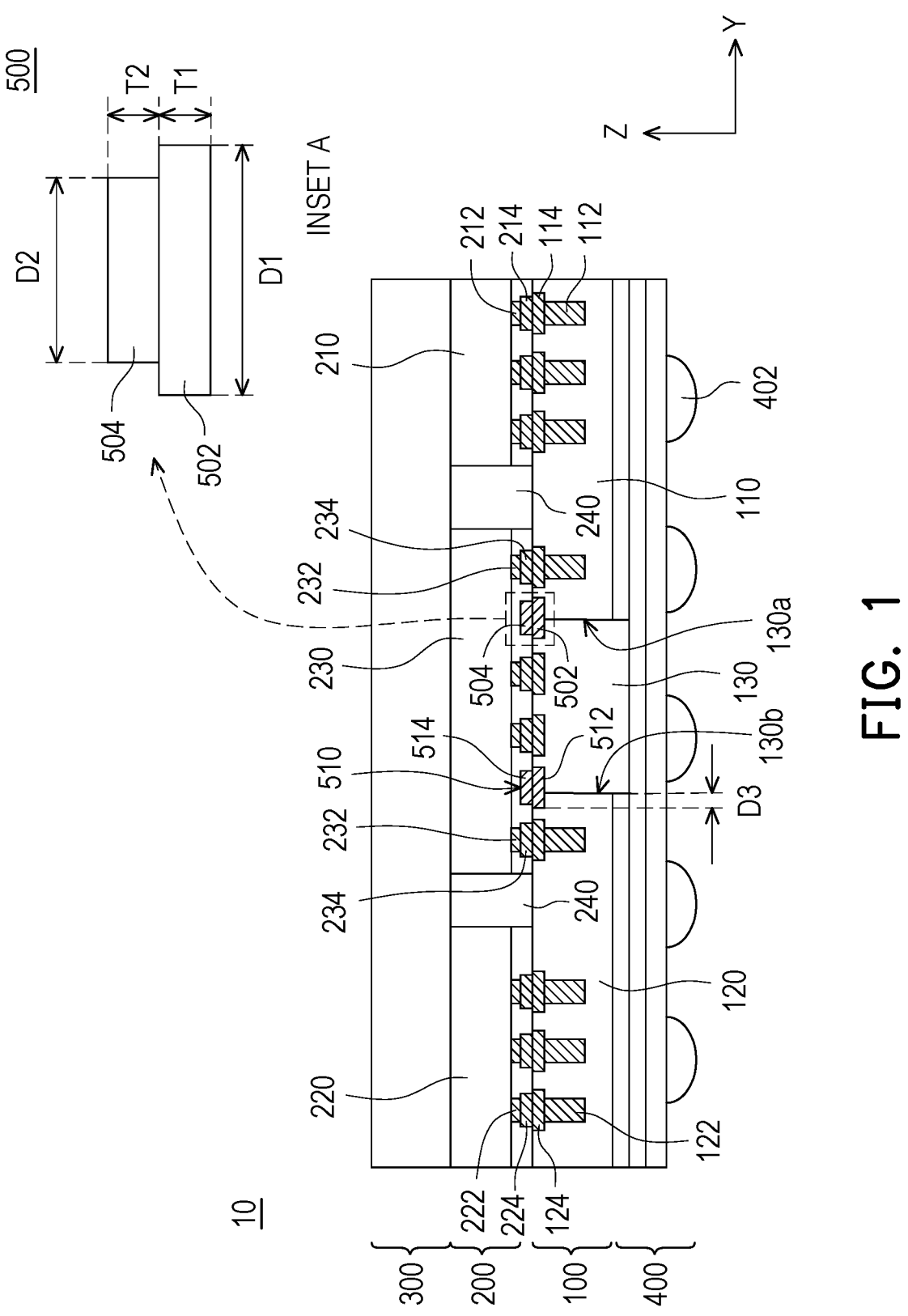
FIG. 1 is a diagrammatic illustration showing a cross-section view of a semiconductor device in accordance with some embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Further, it is to be understood that when an element is referred to as being "connected to" or "coupled to" another element, it may be directly connected to or coupled to the other element, or one or more intervening elements may be present. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "over," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "about" may include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

In accordance with some suitable embodiments, a semiconductor device and/or method for manufacturing the same is disclosed herein. For example, the semiconductor device may comprise or include a system on integrated chip (SoIC) or the like. In some suitable embodiments, the semiconductor device has a multi-tier construction, for example, including a first tier having one or more semiconductor dies therein and a second tier having one or more semiconductor dies therein. Suitably, the first and second tiers are stacked one over the other, for example, such that the second tier overlays the first tier.

In accordance with some suitable embodiments disclosed herein, first and second adjacent semiconductor dies within the first tier of the multi-tier construction are arranged spaced apart from one another in a side-by-side fashion. In practice, a gap between respective ends of the first and second adjacent semiconductor dies may be filled with a suitable fill material, for example, such as a silicon oxide material or other suitable oxide material or other suitable dielectric material or the like. Accordingly, a first interface may be formed at a juncture of the fill material with an end of the first semiconductor die facing the fill material and a second interface may be formed at a juncture of the fill material with an end of the second semiconductor die facing the fill material.

In accordance with some suitable embodiments disclosed herein, a semiconductor bridge die within the second tier of the multi-tier construction overlays and/or spans the gap and/or fill material between the respective ends of the first and second adjacent semiconductor dies within the first tier of the multi-tier construction and at least partially overlays the first and second adjacent semiconductor dies within the first tier of the multi-tier construction. In practice, the semiconductor bridge die within the second tier of the multi-tier construction provides for electrical interconnection and/or communication between the first and second adjacent semiconductor dies within the first tier of the multi-tier construction.

In some cases, during the manufacturing process of the semiconductor device or otherwise, there is a potential to develop cracks at the interface(s) of one or both of the first and/or second semiconductor dies with the fill material therebetween. Moreover, in some cases, this crack may tend to propagate along this interface and potentially into the semiconductor bridge die which in turn has a potential to damage the semiconductor bridge die and/or cause an undesired failure thereof.

In accordance with some suitable embodiments disclosed herein, one or more protective structures may be formed and/or otherwise provided in the semiconductor device. In practice, the protective structures may be formed and/or otherwise provided at the interfaces between the semiconductor bridge die within the second tier of the multi-tier construction and the first and second adjacent semiconductor dies within the first tier of the multi-tier construction, for example, at or near the respective ends of the first and second adjacent semiconductor dies within the first tier of the multi-tier construction. Advantageously, the protective structures suitably protect and/or mitigate against potential crack propagation into the semiconductor bridge die which could otherwise potentially damage the semiconductor bridge die and/or potentially cause undesired failure of the semiconductor bridge die.

Figure 2:
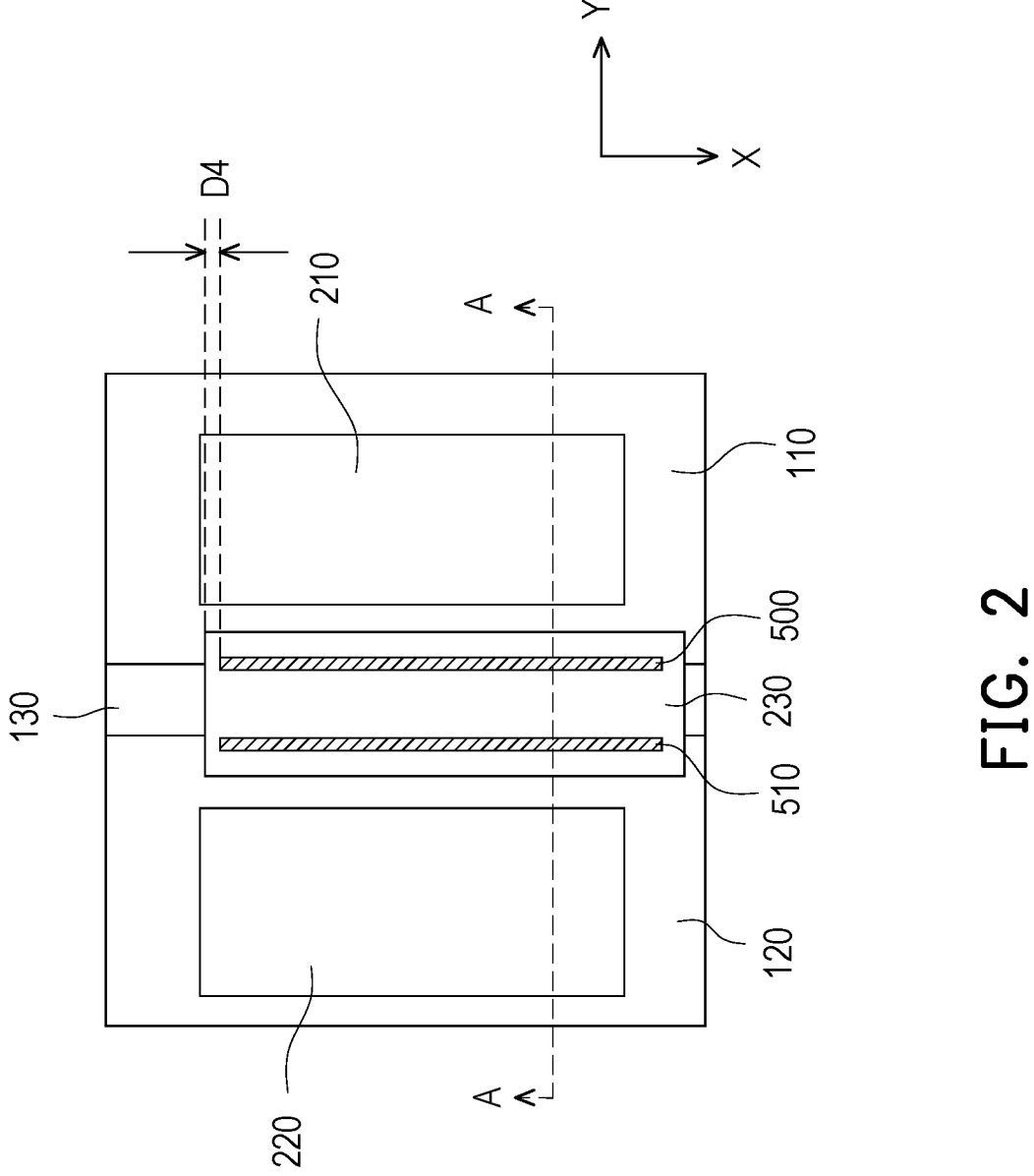
FIG. 2 is a diagrammatic illustration showing a partial top view of the semiconductor device shown in FIG. 1.

With reference now to FIG. 1, there is illustrated a cross-section view of a semiconductor device 10 having one or more semiconductor dies arranged in a multi-tier construction. FIG. 2 illustrates a partial schematic top view of the semiconductor device 10 of FIG. 1, showing selected component, elements and/or structures in the respective tiers of the multi-tier construction. In FIG. 2, the relative layout of various components, element and/or structures are illustrated to show, for example, the vertical alignment and/or overlap of such components, element and/or structures. Accordingly, certain upper components, elements and/or structures (for example, a semiconductor bridge die 230) are shown in phantom and/or with broken lines (at least partially) to reveal one or more underlying components, elements and/or structures (for example, protective structures 500 and 510). FIG. 1 illustrates a cross-sectional view of the semiconductor device 10 taken along a section line A-A shown in FIG. 2, in accordance with various suitable embodiments disclosed herein.

In some suitable embodiments, the semiconductor device 10 may comprise or include a system on integrated chip (SoIC) or the like. As shown, the semiconductor device 10 includes a first tier 100 of semiconductor dies, including a first semiconductor die 110 and a second semiconductor die 120. As shown, the semiconductor device 10 also includes a second tier 200 of semiconductor dies, including a first semiconductor die 210, a second semiconductor die 220 and the semiconductor bridge die 230. In practice, the first and second tiers 100 and 200 may be stacked one upon another, for example, such that certain semiconductor dies within the second tier 200 may align with and/or overlay certain semiconductor dies within the first tier 100. As shown in FIGS. 1 and 2 for example, the first semiconductor die 210 in the second tier 200 of the multi-tier construction aligns with and/or overlays the first semiconductor die 110 in the first tier 100 of the multi-tier construction; and the second semiconductor die 220 in the second tier 200 of the multi-tier construction aligns with and/or overlays the second semiconductor die 120 in the first tier 100 of the multi-tier construction. Additionally, the semiconductor bridge die 230 in the second tier 200 of the multi-tier construction may align with and at least partially overlay both the first and second semiconductor dies 120 and 220 in the first tier 100 of the multi-tier construction.

In some suitable embodiments, as shown in FIG. 1 for example, the first semiconductor die 110 in the first tier 100 of the multi-tier construction may include one or more vias 112, for example, such as through silicon vias (TSVs), bonding pad vias (BPVs), or the like. In practice, the vias 112 may comprise and/or be formed from a metal material, for example, such as copper (Cu) or another suitable metal or alloy, or other suitable electrically conductive material. Suitably, each via 112 may extend to, contact and/or make an electrical connection with a corresponding backside bonding pad 114 residing and/or formed on a first side or face of the first semiconductor die 110. In some suitable embodiments, each bonding pad 114 may be a metal bonding pad, and may also be referred to, at times, as a bonding pad metal (BPM). In some suitable embodiments, each bonding pad 114 may comprise and/or be formed from a metal material, for example, such as copper (Cu) or another suitable metal or alloy, or other suitable electrically conductive material. In some suitable embodiments, the vias 112 and their corresponding bonding pads 114 may comprise and/or be formed from the same metal or material, or alternatively, they may comprise and/or be formed from different metals or materials.

Likewise, in some suitable embodiments, as shown in FIG. 1 for example, the second semiconductor die 120 in the first tier 100 of the multi-tier construction may include one or more vias 122, for example, such as through silicon vias (TSVs), bonding pad vias (BPVs), or the like. In practice, the vias 122 may comprise and/or be formed from a metal material, for example, such as copper (Cu) or another suitable metal or alloy, or other suitable electrically conductive material. Again, suitably, each via 122 may extend to, contact and/or make an electrical connection with a corresponding backside bonding pad 124 residing and/or formed on a first side or face of the second semiconductor die 120. In some suitable embodiments, each bonding pad 124 may be a metal bonding pad, and may also be referred to, at times, as a bonding pad metal (BPM). In some suitable embodiments, each bonding pad 124 may comprise and/or be formed from a metal material, for example, such as copper (Cu) or another suitable metal or alloy, or other suitable electrically conductive material. In some suitable embodiments, the vias 122 and their corresponding bonding pads 124 may comprise and/or be formed from the same metal or material, or alternatively, they may comprise and/or be formed from different metals or materials.

In some suitable embodiments, the first semiconductor die 110 and the second semiconductor die 120 in the first tier 100 of the multi-tier construction are arranged spaced apart from one another in a side-by-side fashion, for example, as shown in FIG. 1. That is to say, the second semiconductor die 120 may be spaced apart from the first semiconductor die 110 by a distance measured along a first direction, for example, in a direction of the Y axis as shown in FIG. 1. For ease of reference and illustrative purposes herein, in some of the FIGURES, the various elements and/or components depicted therein may be shown relative to an otherwise arbitrarily chosen three-dimensional (3D) cartesian coordinate system including mutually orthogonal X, Y and Z axes as shown in the FIGURES. While consistency is maintained among and/or across the various FIGURES (unless otherwise explicitly noted), it is to be appreciated the directions and/or orientations indicated by these axes are chosen primarily for the purpose of facilitating the description provided herein, for example, to describe and/or identify relative orientations and/or directions. Unless otherwise indicated, the illustrated coordinate system and/or axes, in and of themselves, are not intended to be limiting and should not be read or interpreted as such.

In accordance with some suitable embodiments disclosed herein, a gap between respective ends of the first and second adjacent semiconductor dies 110 and 120 may be filled with a suitable fill material 130, for example, such as a silicon oxide material or other suitable oxide material or other suitable dielectric material or the like. Accordingly, a first interface 130a may be formed at a juncture of the fill material 130 with an end of the first semiconductor die 110 facing the fill material 130 and a second interface 130b may be formed at a juncture of the fill material 130 with an end of the second semiconductor die 120 facing the fill material 130.

In some suitable embodiments, in the second tier 200 of the multi-tier construction, the first semiconductor die 210, the semiconductor bridge die 230 and the second semiconductor die 220 are also arranged spaced apart from one another in a side-by-side fashion, for example, as shown in FIG. 1. That is to say, the semiconductor bridge die 230 is positioned and/or located between the first semiconductor die 210 and the second semiconductor die 220, with the bridge die 230 being spaced apart from the first semiconductor die 210 by a distance measured along a first direction, for example, in a direction of the Y axis as shown in FIG. 1, and the second semiconductor die 220 being spaced apart from the semiconductor bridge die 230 by a distance measured along this first direction. Suitably, as shown in FIG. 1 for example, the gap between the respective ends of the first semiconductor die 210 and the semiconductor bridge die 230 and the gap between the respective ends of the second semiconductor die 220 and the semiconductor bridge die 230 may be filled with a suitable fill material 240, for example, such as a silicon oxide material or other suitable oxide material or other suitable dielectric material or the like.

In some suitable embodiments, as shown in FIG. 1 for example, the first semiconductor die 210 in the second tier 200 of the multi-tier construction may include one or more vias 212, for example, such as through silicon vias (TSVs), bonding pad vias (BPVs), or the like. In practice, the vias 212 may comprise and/or be formed from a metal material, for example, such as copper (Cu) or another suitable metal or alloy, or other suitable electrically conductive material. Suitably, each via 212 may extend to, contact and/or make an electrical connection with a corresponding bonding pad 214 residing and/or formed on a first side or face of the first semiconductor die 210. In some suitable embodiments, each bonding pad 214 may be a metal bonding pad, and may also be referred to, at times, as a bonding pad metal (BPM). In some suitable embodiments, each bonding pad 214 may comprise and/or be formed from a metal material, for example, such as copper (Cu) or another suitable metal or alloy, or other suitable electrically conductive material. In some suitable embodiments, the vias 212 and their corresponding bonding pads 214 may comprise and/or be formed from the same metal or material, or alternatively, they may comprise and/or be formed from different metals or materials.

Likewise, in some suitable embodiments, as shown in FIG. 1 for example, the second semiconductor die 220 in the second tier 200 of the multi-tier construction may include one or more vias 222, for example, such as through silicon vias (TSVs), bonding pad vias (BPVs), or the like. In practice, the vias 222 may comprise and/or be formed from a metal material, for example, such as copper (Cu) or another suitable metal or alloy, or other suitable electrically conductive material. Again, suitably, each via 222 may extend to, contact and/or make an electrical connection with a corresponding bonding pad 224 residing and/or formed on a first side or face of the second semiconductor die 220. In some suitable embodiments, each bonding pad 224 may be a metal bonding pad, and may also be referred to, at times, as a bonding pad metal (BPM). In some suitable embodiments, each bonding pad 224 may comprise and/or be formed from a metal material, for example, such as copper (Cu) or another suitable metal or alloy, or other suitable electrically conductive material. In some suitable embodiments, the vias 222 and their corresponding bonding pads 224 may comprise and/or be formed from the same metal or material, or alternatively, they may comprise and/or be formed from different metals or materials.

Additionally, in some suitable embodiments, as shown in FIG. 1 for example, the semiconductor bridge die 230 in the second tier 200 of the multi-tier construction may include one or more vias 232, for example, such as through silicon vias (TSVs), bonding pad vias (BPVs), or the like. In practice, the vias 232 may comprise and/or be formed from a metal material, for example, such as copper (Cu) or another suitable metal or alloy, or other suitable electrically conductive material. Again, suitably, each via 232 may extend to, contact and/or make an electrical connection with a corresponding bonding pad 234 residing and/or formed on a first side or face of the semiconductor bridge die 230. In some suitable embodiments, each bonding pad 234 may be a metal bonding pad, and may also be referred to, at times, as a bonding pad metal (BPM). In some suitable embodiments, each bonding pad 234 may comprise and/or be formed from a metal material, for example, such as copper (Cu) or another suitable metal or alloy, or other suitable electrically conductive material. In some suitable embodiments, the vias 232 and their corresponding bonding pads 234 may comprise and/or be formed from the same metal or material, or alternatively, they may comprise and/or be formed from different metals or materials. The bridge die 230 may include, for example and without limitation, back end of line (BEOL) routing and/or processing to facilitate electrical interconnection with the first semiconductor die 110 and the second semiconductor die 120.

In some suitable embodiments, as shown in FIG. 1 for example, the bonding pads 214 of the first semiconductor die 210 in the second tier 200 of the multi-tier construction align with corresponding bonding pads 114 of the first semiconductor die 110 in the first tier 100 of the multi-tier construction. In practice, the corresponding bonding pads 114 and 214 contact, are joined and/or otherwise cooperate with one another to provide one or more electrical interconnections between the first semiconductor die 110 in the first tier 100 of the multi-tier construction and the first semiconductor die 210 in the second tier 200 of the multi-tier construction.

Likewise, in some suitable embodiments, as shown in FIG. 1 for example, the bonding pads 224 of the second semiconductor die 220 in the second tier 200 of the multi-tier construction align with corresponding bonding pads 124 of the second semiconductor die 120 in the first tier 100 of the multi-tier construction. In practice, the corresponding bonding pads 124 and 224 contact, are joined and/or otherwise cooperate with one another to provide one or more electrical interconnections between the second semiconductor die 120 in the first tier 100 of the multi-tier construction and the second semiconductor die 220 in the second tier 200 of the multi-tier construction.

Additionally, in some suitable embodiments, as shown in FIG. 1 for example, at least one of the bonding pads 234 of the semiconductor bridge die 230 in the second tier 200 of the multi-tier construction aligns with at least one corresponding bonding pad 114 of the first semiconductor die 110 in the first tier 100 of the multi-tier construction. In practice, these corresponding bonding pads 114 and 234 contact, are joined and/or otherwise cooperate with one another to provide at least one electrical interconnection between the first semiconductor die 110 in the first tier 100 of the multi-tier construction and the semiconductor bridge die 230 in the second tier 200 of the multi-tier construction. Furthermore, in some suitable embodiments, as shown in FIG. 1 for example, at least one of the bonding pads 234 of the semiconductor bridge die 230 in the second tier 200 of the multi-tier construction aligns with at least one corresponding bonding pad 124 of the second semiconductor die 120 in the first tier 100 of the multi-tier construction. In practice, these corresponding bonding pads 124 and 234 contact, are joined and/or otherwise cooperate with one another to provide one or more electrical interconnections between the second semiconductor die 120 in the first tier 100 of the multi-tier construction and the semiconductor bridge die 230 in the second tier 200 of the multi-tier construction. Accordingly, through the corresponding pair of bonding pads 114 and 234 and the corresponding pair of bonding pads 124 and 234, the semiconductor bridge die 230 in the second tier 200 of the multi-tier construction acts to provide one or more electrical interconnections between the first and second semiconductor dies 110 and 120 in the first tier 100 of the multi-tier construction.

In some suitable embodiments, any one or more of the various semiconductor dies 110, 120, 210, 220 and/or 230 may be singulated from one or more semiconductor wafers, for example. In some embodiments, any one or more of the various first and second semiconductor dies 110, 120, 210 and/or 220 may be device dies. For example, suitable device dies include, without limitation, an Application-Specific Integrated Circuit (ASIC) chip, a System on Chip (SoC), an analog chip, a sensor chip, a wireless and radio frequency chip, a voltage regulator chip, a logic die such as a Central Processing Unit (CPU) die, a Micro Control Unit (MCU) die, a BaseBand (BB) die, an Application Processor (AP) die, or a memory chip such as a Dynamic Random Access Memory (DRAM) die, a Static Random Access Memory (SRAM) die, or a High Bandwidth Memory (HBM) chip, or the like, or other suitable types of semiconductor die, for example. In some embodiments, the plurality of semiconductor dies may be the same types of dies or different types of dies.

In some suitable embodiments, any one or more of the various semiconductor dies may include a substrate, a plurality of pads (e.g., such as the illustrated bonding pads), a passivation layer, and a plurality of connectors. In some embodiments, the substrate may be made of silicon or other semiconductor materials. Alternatively or additionally, the substrate may include other elementary semiconductor materials such as germanium, gallium arsenic, or other suitable semiconductor materials. In some embodiments, the substrate may further include other features such as various doped regions, a buried layer, and/or an epitaxy layer. Moreover, in some embodiments, the substrate may be made of an alloy semiconductor such as silicon germanium, silicon germanium carbide, gallium arsenic phosphide, or gallium indium phosphide. Furthermore, the substrate may be a semiconductor on insulator such as silicon on insulator (SOI) or silicon on sapphire.

In some embodiments, a plurality of electronic elements (not shown) may be formed in and/or on the substrate. These electronic elements may be active devices, passive devices, or combinations thereof. For example, these electronic elements may include, without limitation, transistors, capacitors, resistors, diodes, photodiodes, fuse devices, or the like, or combinations thereof. In some embodiments, an interconnection structure (not shown) including a dielectric structure and interconnect wirings may be formed over the electronic elements formed in and/or on the substrate. The interconnection wirings may be embedded in the dielectric structure and electrically connected to the electronic elements to form a functional circuit. In some embodiments, the dielectric structure may include inter-layer dielectric layers (ILDs) and inter-metal dielectric layers (IMDs). The interconnect wirings may include multiple layers of conductive lines, conductive vias, and conductive contacts. The conductive contacts may be formed in the ILDs to electrically connect the conductive lines to the electronic elements;

the conductive vias may be formed in the IMDs to electrically connect the conductive lines in different layers. The interconnect wirings may include metal, metal alloy or a combination thereof, such as tungsten (W), copper (Cu), copper alloys, aluminum (Al), aluminum alloys, or combinations thereof.

In some suitable embodiments, respective pads (such as the illustrated bonding pads) of the various semiconductor dies may be electrically connected (for example, by the illustrated vias) to a top conductive feature of respective interconnection structures incorporated in the various semiconductor dies, and further electrically connected to the electronic elements formed in and/or on the substrate of the various semiconductor dies through the interconnection structure. The material of the pads may include metal or metal alloys, such as aluminum (Al), copper (Cu), nickel (Ni), or alloys thereof.

Returning attention now to FIG. 1, in accordance with some suitable embodiments, the semiconductor device 10 may include a suitable support member 300. In practice, the multi-tier construction including the first tier 100 and the second tier 200 of semiconductor dies may be secured and/or attached to and/or otherwise supported on and/or by the support member 300. For example, the support member 300 may comprise and/or include a layer of silicon (Si) material or other like construction of suitable support material. As shown in FIG. 1, the multi-tier construction is supported by the support member 300 from the second-tier 200 of the multi-tier construction.

In some suitable embodiments, the semiconductor device may further include a structure 400, for example arranged on the first tier 100 of the multi-tier construction. Suitably, the structure 400 provides external electrical access to and/or connections with the first and second semiconductor dies 110 and 120 within the first tier 100 of the multi-tier construction, for example, through one or more exposed electrically conductive solder balls or bumps 402 formed and/or otherwise provided on the structure 400. In some suitable embodiments, the structure 400 may be a multilayer construction and may include a redistribution layer (RDL) which electrically interconnects the bumps 402 with selected contacts or pads on the first and second semiconductor dies 110 and 120 within the first tier 100 of the multi-tier construction.

In accordance with some suitable embodiments, a first protective structure 500 is formed and/or otherwise provided in the semiconductor device 10 so as to be aligned with, span and/or overlay the first interface 130a between the fill material 130 and the first semiconductor die 110 in the first tier 100 of the multi-tier construction. INSET A of FIG. 1 shows an enlarged or magnified view of the first protective structure 500. Suitably, the first protective structure 500 may comprise and/or be formed from a first part 502 and a second part 504.

In practice, the first part 502 of the first protective structure 500 is formed and/or otherwise provided on the first side of the first semiconductor die 110 at an end thereof facing and/or making a juncture with the fill material 130, i.e., such that the first protective structure 500 and/or the first part 502 thereof overlay and/or span the first interface 130a. Suitably, the first part 502 of the first protective structure 500 at least partially overlaps the first semiconductor die 110 as shown in FIG. 1, for example, by an amount D3 greater than or equal to about 1 micrometer (μm) measured in a direction of the Y axis as shown in FIG. 1. In some suitable embodiments, the first part 502 of the first protective structure 500 may extend (for example, in a direction of the Y axis as shown in FIG. 1) over the first interface 130a and at least partially overlap the fill material 130, i.e., such that the first part 502 of the first protective structure 500 spans the first interface 130a.

Suitably, the second part 504 of the first protective structure 500 is formed and/or otherwise provided on the first side of the semiconductor bridge die 230 facing the first side of the first semiconductor die 110. In practice, the second part 504 of the first protective structure 500 is positioned on the semiconductor bridge die 230 so as to align with and/or overlay the first part 502 of the first protective structure 500. In some suitable embodiments, the second part 502 of the first protective structure 500 may likewise extend across and/or span the first interface 130a, for example, in a direction of the Y axes.

In some suitable embodiments, as shown in INSET A of FIG. 1 for example, the first part 502 of the first protective structure 500 may have a thickness T1, for example, measured in a direction of the Z axis, and a width D1, for example, measured in a direction of the Y axis, while the second part 504 of the first protective structure 500 may have a thickness T2, for example, measured in a direction of the Z axis, and a width D2, for example, measure in a direction of the Y axis. In some suitable embodiments, the thicknesses T1 and T2 may be about equal to one another and/or each may be greater than or equal to about 1 μm. In some suitable embodiments, the width D1 may be greater than the width D2 and the width D2 may be greater than or equal to about 2.5 μm.

In some suitable embodiment, the first part 502 of the protective structure 500 may comprise and/or include a wall of metal or other suitable material that runs and/or extents along a length (for example in a direction of the X axis as shown in FIG. 2) of the first semiconductor dies 110, and the second part 504 of the protective structure 500 may comprise and/or include a wall of metal or other suitable material that runs and/or extents along a length (for example in a direction of the X axis as shown in FIG. 2) of the semiconductor bridge dies 230. In practice, the metal walls comprising the first and second parts 502 and 504 of the protective structure 500 may be formed in conjunction with the forming of the illustrated bonding pads on the respective dies 110 and 230, for example, at the same time, in the same manufacturing process step (such as a metallization process) and/or with the same material as the illustrated bonding pads.

In some suitable embodiments, as shown in FIG. 2 for example, the first protective structure 500 (for example, including the first and second parts 502 and 504 thereof) has a length that stops short of either end of semiconductor bridge die 230 by an amount or distance D4, for example, measured in a direction of the X axis as shown in FIG. 2. In some suitable embodiments, the amount or distance D4 may be greater than or equal to about 1 μm.

Notably, a protective structure 500 meeting and/or substantially consistent with the aforementioned-dimensions can assist in achieving, without limitation, one or more of the following advantages: (i) a protective structure 500 suitably strong and/or robust enough to effectively inhibit crack propagation into the semiconductor bridge die 230; and (ii) a protective structure 500 being of sufficient size to thoroughly overlay and/or span the interface 130a where potential crack formation may originate, without unnecessarily taking up additional space, thereby allowing for a more compact semiconductor device 10.

In accordance with some suitable embodiments, a second protective structure 510 may be formed and/or otherwise provided in the semiconductor device 10 so as to be aligned with, span and/or overlay the second interface 130b between the fill material 130 and the second semiconductor die 120 in the first tier 100 of the multi-tier construction. In general, the second protective structure 510 may be similarly constructed, dimensioned and/or formed like the first protective structure 500 shown INSET A of FIG. 1. Suitably, the second protective structure 510 may comprise and/or be formed from a first part 512 and a second part 514.

In practice, the first part 512 of the second protective structure 510 is formed and/or otherwise provided on the first side of the second semiconductor die 120 at an end thereof facing and/or making a juncture with the fill material 130, i.e., such that the second protective structure 510 and/or the first part 512 thereof overlay and/or span the second interface 130b. Suitably, the first part 512 of the second protective structure 510 at least partially overlaps the second semiconductor die 120 as shown in FIG. 1, for example, by an amount D3 greater than or equal to about 1 micrometer (μm) measured in a direction of the Y axis as shown in FIG. 1. In some suitable embodiments, the first part 512 of the second protective structure 510 may extend (for example, in a direction of the Y axis as shown in FIG. 1) over the second interface 130b and at least partially overlap the fill material 130, i.e., such that the first part 502 of the second protective structure 510 spans the second interface 130b.

Suitably, the second part 514 of the second protective structure 510 is formed and/or otherwise provided on the first side of the semiconductor bridge die 230 facing the first side of the second semiconductor die 120. In practice, the second part 514 of the second protective structure 510 is positioned on the semiconductor bridge die 230 so as to align with and/or overlay the first part 512 of the second protective structure 510. In some suitable embodiments, the second part 512 of the second protective structure 510 may likewise extend across and/or span the second interface 130b, for example, in a direction of the Y axes.

In some suitable embodiments, the first part 512 of the second protective structure 510 may have a thickness T1, for example, measured in a direction of the Z axis, and a width D1, for example, measured in a direction of the Y axis, while the second part 514 of the second protective structure 510 may have a thickness T2, for example, measured in a direction of the Z axis, and a width D2, for example, measure in a direction of the Y axis. In some suitable embodiments, the thicknesses T1 and T2 may be about equal to one another and/or each may be greater than or equal to about 1 μm. In some suitable embodiments, the width D1 may be greater than the width D2 and the width D2 may be greater than or equal to about 2.5 μm.

In some suitable embodiment, the first part 512 of the protective structure 510 may comprise and/or include a wall of metal or other suitable material that runs and/or extents along a length (for example in a direction of the X axis as shown in FIG. 2) of the second semiconductor dies 120, and the second part 514 of the protective structure 510 may comprise and/or include a wall of metal or other suitable material that runs and/or extents along a length (for example in a direction of the X axis as shown in FIG. 2) of the semiconductor bridge dies 230. In practice, the metal walls comprising the first and second parts 512 and 514 of the protective structure 510 may be formed in conjunction with the forming of the illustrated bonding pads on the respective dies 120 and 230, for example, at the same time, in the same manufacturing process step (such as a metallization process) and/or with the same material as the illustrated bonding pads.

In some suitable embodiments, as shown in FIG. 2 for example, the second protective structure 510 (for example, including the first and second parts 512 and 514 thereof) has a length that stops short of either end of semiconductor bridge die 230 by an amount or distance D4, for example, measured in a direction of the X axis as shown in FIG. 2. In some suitable embodiments, the amount or distance D4 may be greater than or equal to about 1 μm.

Notably, a protective structure 510 meeting and/or substantially consistent with the aforementioned-dimensions can assist in achieving, without limitation, one or more of the following advantages: (i) a protective structure 510 suitably strong and/or robust enough to effectively inhibit crack propagation into the semiconductor bridge die 230; and (ii) a protective structure 510 being of sufficient size to thoroughly overlay and/or span the interface 130b where potential crack formation may originate, without unnecessarily taking up additional space, thereby allowing for a more compact semiconductor device 10.

In accordance with some suitable embodiments, the various parts (for example, parts 502 and 504 of the first protective structure 500 and parts 512 and 514 of the second protective structure 510) are not electrically connected to the various electronic elements provided within their respective semiconductor dies (for example, the first and second semiconductor dies 110 and 120 and the semiconductor bridge die 230). That is to say, the protective structures 500 and 510 do not serve or act as or otherwise provide electrical interconnections between the respective first and second semiconductor dies 110 and 120 and the semiconductor bridge die 230.

Figure 3:
FIG. 3 includes a flow chart illustrating a method and/or process for manufacturing the semiconductor device shown in FIG. 1 in accordance with some embodiments disclosed herein.
Figures 4A, 4B, 4C:
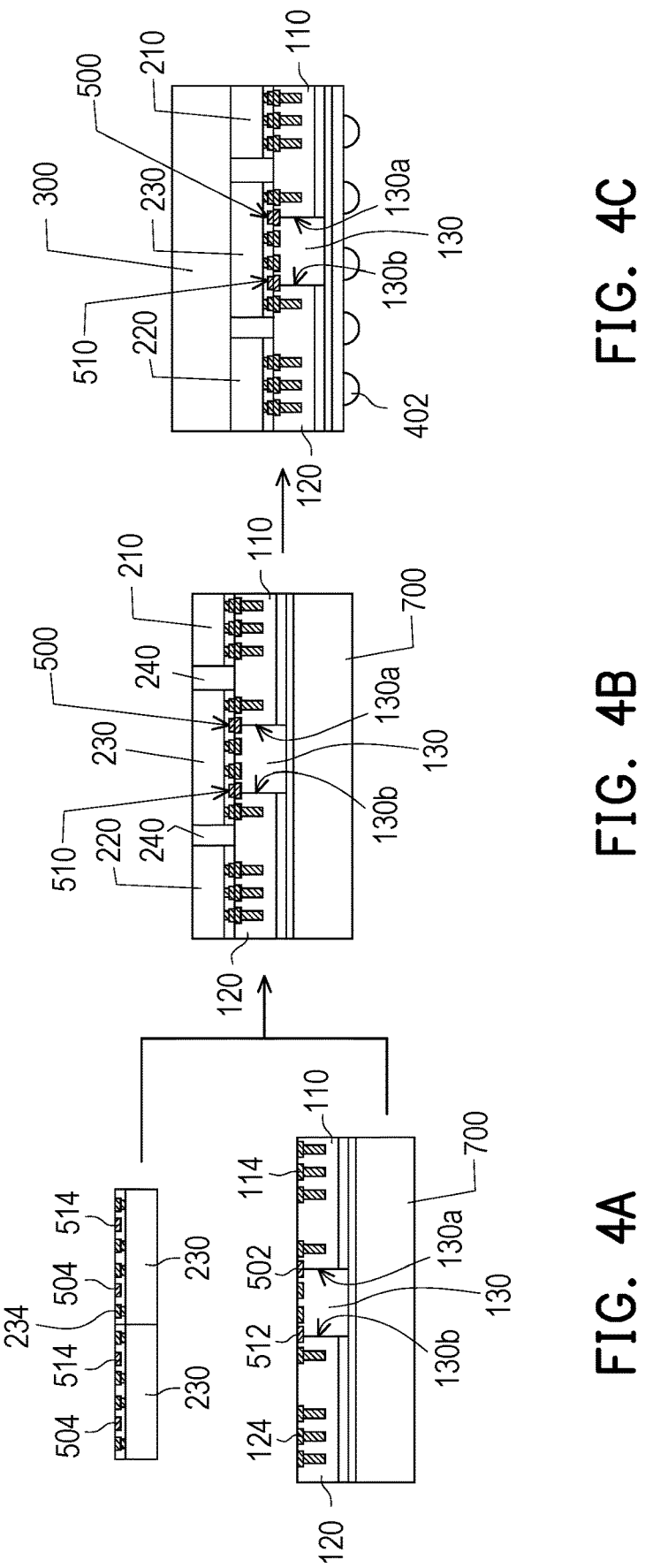
FIGS. 4A-4C provide illustrations of the semiconductor device at varying stages of manufacturing in accordance with some embodiments.

With reference now to FIG. 3, a method of manufacturing the semiconductor device 10 in accordance with some suitable embodiments is disclosed. FIGS. 4A, 4B, and 4C show cross-sectional views of various components and/or the semiconductor device 10 at various stages of a suitable manufacturing process in conjunction with the a flow chart depicted in FIG. 3 identifying illustrative steps of the manufacturing process to which the various stages correspond.

In accordance with some suitable embodiments, as shown in FIG. 3 and with reference to FIG. 4A, the process may include a first step 600 in which the parts 502, 504, 512 and 514 of the protective structures 500 and 510 are formed on their respective semiconductor dies. At this stage, the semiconductor bridge die 230 may not yet be attached and/or joined to the first and second semiconductor dies 110 and 120. Accordingly, the respective sides and/or faces on which the respective parts 502, 504, 512 and 514 are formed remain exposed and/or otherwise accessible for carrying out one or more semiconductor processing steps thereon.

In accordance with some suitable embodiment, the first semiconductor die 110 and the second semiconductor die 120 may be temporarily secured to and/or carried by a carrier or support member 700 at this stage of the manufacturing process. However, the carrier or support member 700 will later be detached and removed at a suitable stage of the manufacturing process. In practice, while the first and second semiconductor dies 110 and 120 are positioned on the carrier or support member 700, the fill material 130 may be deposited or otherwise formed in the gap between the first and second semiconductor dies 110 and 120, thereby establishing interfaces 130a and 130b. Suitably, thereafter, the first parts 502 and 512 of the respective protective structures 500 and 510 may be formed overlaying and/or spanning the respective interfaces 130a and 130b.

In some suitable embodiments, the parts 502 and 512 may be formed by (i) creating channels overlaying and/or spanning the interfaces 130a and 130b and then (ii) filling the channels with a suitable metal or another suitable material, for example, using a suitable metallization process. In practice, the created channels will define the location and dimensions of the parts 502 and 512. In practice, the channels may be formed, for example, using any suitable material removal semiconductor processing technique, including but not limited to photolithography, In some suitable embodiments, the parts 502 and 512 may be formed in conjunction with the forming of the bonding pads 114 and/or 124 on the respective dies 110 and 120, for example, at the same time, in the same manufacturing process step (such as a metallization process) and/or with the same material as the bonding pads 112 and/or 124.

As shown in FIG. 3, at step 600, and in FIG. 4A, the second parts 504 and 514 of the protective structures 500 and 510 may also be formed on the semiconductor bridge die 230, for example, in parallel with forming the first parts 502 and 512 over the interfaces 130a and 130b. In some suitable embodiments, the parts 504 and 514 may be formed by (i) creating channels at appropriate locations on the semiconductor bridge die 230, and then (ii) filling the channels with a suitable metal or another suitable material, for example, using a suitable metallization process. In practice, the created channels will define the positions and dimensions of the parts 504 and 514. In practice, the channels may be formed, for example, using any suitable material removal semiconductor processing technique, including but not limited to photolithography, In some suitable embodiments, the parts 504 and 514 may be formed in conjunction with the forming of the bonding pads 234 on the semiconductor bridge die 230, for example, at the same time, in the same manufacturing process step (such as a metallization process) and/or with the same material as the bonding pads 234.

In some suitable embodiments, as shown in FIGS. 3-4C for example, a plurality of semiconductor bridge dies 230 may be provided and/or defined on a common semiconductor wafer or the like and the parts 504 and 514 may be formed simultaneously or otherwise in the same manufacturing process step on each of the semiconductor bridge dies 230. Subsequently, individual bridge dies 230 may be diced or otherwise singulated therefrom.

In accordance with some suitable embodiments, subsequent to step 600, a chip on wafer (CoW) process may be performed at step 610 to bond and/or otherwise attached the semiconductor dies (i.e., dies 210, 220 and 230), which will constitute the second tier 200 of the multi-tier construction, over the semiconductor dies (i.e., dies 110 and 120), which constitute the first tier 100 of the multi-tier construction. FIG. 4B provides an illustrative example of this stage of the manufacturing process. In practice, this process or step 610 may include picking, aligning and/or placing the dies 210 and 220 over corresponding dies 110 and 120 such that the bonding pads 214 and 224 on dies 210 and 220 face and align with the corresponding bonding pads 114 and 124 on the respective dies 110 and 120. Likewise, the semiconductor bridge die 230 may be picked, aligned and/or placed over the fill material 130 and corresponding dies 110 and 120 such that (i) the bonding pads 234 of the bridge die 230 face and align with their corresponding bonding pads 114 and 124 on the respective first and second dies 110 and 120, and (ii) the second parts 504 and 514 of the respective protective structures 500 and 510 face and align with the first parts 502 and 512 of the respective protective structures 500 and 510.

In practice, the CoW process and/or step 610 may further include conducting a hybrid bonding technique (for example, such as direct bond interconnect (DBI)) in which the first parts 502 and 512 are merged with their corresponding second parts 504 and 514 to create unitary and/or continuous robust protective structures 500 and 510, respectively. In some alternative embodiments, other methods may be employed for joining the respective first and second parts to form the protective structures, for example, with the resulting protective structure being unitary and/or continuous or otherwise. Suitably, in step 610, the bonding process may also bond the second-tier dies 210 and 220 and/or their bonding pads 214 and 224 with the corresponding first-tier dies 110 and 120 and/or their bonding pads 114 and 124.

In some suitable embodiments, having bonded the second-tier dies 210, 220 and 230 to the first-tier dies 110 and 120 accordingly, the second-tier fill material 240 may be deposited and/or otherwise placed in the gaps between the respective second-tier dies 210, 220 and 230.

In some suitable embodiments, at step 620 for example, as shown in FIG. 3 and FIG. 4C, the support member 300 and the established second tier 200 of the multi-tier construction may be joined, bonded and/or otherwise attached or secured to one another, the temporary carrier or support 700 may be detached and/or removed, and a further SoIC process followed until formation of the bumps 402.

In the following, some further illustrative embodiments are described.

In some embodiments, a semiconductor device with a multi-tier construction includes: a first tier having therein a first semiconductor die, a second semiconductor die spaced apart from the first semiconductor die in a first direction and a fill material disposed between the first and second semiconductor dies; a second tier overlaying the first tier, the second tier having therein a semiconductor bridge die which at least partially overlays the fill material, at least partially overlays the first semiconductor die and at least partially overlays the second semiconductor die, the semiconductor bridge die providing an electrical interconnection between the first and second semiconductor dies in the first tier; and a first protective structure aligned with a first interface between an end of the first semiconductor die and the fill material. Suitably, the first protective structure includes: a first part formed on a first side of the first semiconductor die at the end of the first semiconductor die; and a second part formed on a first side of the semiconductor bridge die, the first side of the semiconductor bridge die facing the first side of the first semiconductor die. Suitably, the first and second parts align with one another and are joined together to form the first protective structure aligned with the first interface, the first protective structure mitigating against a potential crack at the first interface from propagating into the semiconductor bridge die.

In some further embodiments, the semiconductor device further includes: a second protective structure aligned with a second interface between an end of the second semiconductor die and the fill material. Suitably, the second protective structure includes: a third part formed on a first side of the second semiconductor die at the end of the second semiconductor die; and a fourth part formed on the first side of the semiconductor bridge die, the first side of the semiconductor bridge die facing the first side of the second semiconductor die. Suitably, the third and fourth parts align with one another and are joined together to form the second protective structure aligned with the second interface, the second protective structure mitigating against a potential crack at the second interface from propagating into the semiconductor bridge die.

In still additional embodiments, the first part of the first protective structure at least partially overlaps the first semiconductor die at the end of the first semiconductor die, and extends from the end of the first semiconductor die along the first direction to at least partially overlap the fill material.

In some further embodiments, the first part is a first metal wall extending along the first side of the first semiconductor die in a second direction which is perpendicular to the first direction, and the second part of the first protective structure is a second metal wall extending along the first side of the semiconductor bridge die in the second direction.

In yet further embodiments, a width of the first part measured along the first direct is greater than a width of the second part measured along the first direction.

In some further embodiments, the fill material is an oxide.

In some embodiments, the semiconductor device comprises a system on integrated chip.

In yet further embodiments, the semiconductor device further includes: a first electrically conductive bonding pad formed on the first side of the semiconductor bridge die; a second electrically conductive bonding pad formed on the first side of the semiconductor bridge die; a third electrically conductive bonding pad formed on the first side of the first semiconductor die; and a fourth electrically conductive bonding pad formed on the first side of the second semiconductor die. Suitably, the first and third electrically conductive bonding pads align and cooperate with one another to provide a first electrical interconnection between the first semiconductor die and the semiconductor bridge die, and the second and fourth electrically conductive bonding pads align and cooperate with one another to provide a second electrical interconnection between the second semiconductor die and the semiconductor bridge die.

In some embodiments, a system on integrated chip (SoIC) includes: a first tier of dies including therein a first die, a second die spaced apart from the first die and a fill material disposed between the first and second dies, the fill material, first die and second die defining (i) a first interface between the first die and the fill material and (ii) a second interface between the second die and the fill material; a second tier of dies disposed on the first tier, the second tier including therein a third die disposed on the first die, a fourth die disposed on the second die and a bridge die disposed to span the fill material, the bridge die at least partially overlapping the first die and at least partially overlapping the second die, such that the bridge die provides at least one electrical interconnection between the first and second dies; a first wall formed on a first side of the first tier of dies, the first wall spanning the first interface; a second wall formed on the first side of the first tier of dies, the second wall spanning the second interface; a third wall formed on a first side of the bridge die so as to face and align with the first wall; and a fourth wall formed on the first side of the bridge die so as to face and align with the second wall. Suitably, the first and third walls are merged together to create a first protective structure spanning the first interface and the second and fourth walls are merged together to create a second protective structure spanning the second interface.

In some further embodiments, the first protective structure inhibits crack propagation into the bridge die from the first interface and the second protective structure inhibits crack propagation into the bridge die from the second interface.

In still further embodiments, the first wall has a first width measured in a first direction, the first direction being transverse to a plane of the first interface; the second wall has a second width measure in the first direction; the third wall has a third width measured in the first direction; the fourth wall has a width measured in the first direction; the first width is greater than the third width; and the second width is greater than the fourth width.

In yet additional embodiments, the first, second, third and fourth walls are formed of metal.

In some further embodiments, the first and third walls are merged together and the second and fourth walls are merged together through metal-to-metal bonds and dielectric-to-dielectric bonds.

In some additional embodiments, the fill material is an oxide.

In some embodiments, a method of manufacturing a semiconductor device having a multi-tier construction of dies includes: arranging a first die and a second die in a first tier of the multi-tier construction with a gap therebetween, the first tier of the multi-tier construction having a first side; filling the gap with a fill material such that an interface is formed between the first die and the fill material; forming a first part of a protective structure on the first side of the first tier of the multi-tier construction such that the first part of the protective structure spans the interface; forming a second part of the protective structure on a first side of a bridge die; arranging the bridge die in a second tier of the multi-tier construction such that the first side of the bridge die faces the first side of the first tier of the multi-tier construction and the second part of the protective structure aligns with the first part of the protective structure, the bridge die providing an electrical interconnection between the first and second dies; and joining the first and second parts of the protective structure together.

In some embodiments, the joining comprises merging the first and second parts to create a continuous protective structure.

In some further embodiments, the joining comprises performing at least one of a hybrid binding process and a direct bond interconnect process to merge the first and second pasts together.

In still further embodiments, forming the first part of the protective structure includes forming a first channel on the first side of the first tier of the multi-tier construction such that the first channel spans the interface and filling the first channel with metal to create a first metal wall which spans the interface; and forming the second part of the protective structure includes forming a second channel on the first side of the bridge die and filling the second channel with metal to create a second metal wall.

In yet further embodiments, the method further includes mitigating crack propagation from the interface into the bridge die with the protective structure.

In still one more embodiment, the first and second parts of the protective structure are not electrically connected to electronic elements within the first die, second die or bridge die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device with a multi-tier construction comprising:
   a first tier having therein a first semiconductor die, a second semiconductor die spaced apart from the first semiconductor die in a first direction and a fill material disposed between the first and second semiconductor dies;
   a second tier overlaying the first tier, the second tier having therein a semiconductor bridge die which at least partially overlays the fill material, at least partially overlays the first semiconductor die and at least partially overlays the second semiconductor die, said semiconductor bridge die providing electrical interconnection between the first and second semiconductor dies in the first tier; and
   a first protective structure aligned with a first interface between an end of the first semiconductor die and the fill material, said first protective structure including:
      a first part formed on a first side of the first semiconductor die at the end of the first semiconductor die; and
      a second part formed on a first side of the semiconductor bridge die, said first side of the semiconductor bridge die facing the first side of the first semiconductor die;
   wherein the first and second parts align with one another and are physically joined together to form the first protective structure aligned with the first interface, said first protective structure mitigating against a potential crack at the first interface from propagating into the semiconductor bridge die.

2. The semiconductor device of claim 1, further comprising:
   a second protective structure aligned with a second interface between an end of the second semiconductor die and the fill material, said second protective structure including:
      a third part formed on a first side of the second semiconductor die at the end of the second semiconductor die; and
      a fourth part formed on the first side of the semiconductor bridge die, said first side of the semiconductor bridge die facing the first side of the second semiconductor die;
   wherein the third and fourth parts align with one another and are physically joined together to form the second protective structure aligned with the second interface, said second protective structure mitigating against a potential crack at the second interface from propagating into the semiconductor bridge die.

3. The semiconductor device of claim 1, wherein the first part of the first protective structure:
   at least partially overlaps the first semiconductor die at the end of the first semiconductor die; and
   extends from the end of the first semiconductor die along the first direction to at least partially overlap the fill material.

4. The semiconductor device of claim 1, wherein the first part is a first metal wall extending along the first side of the first semiconductor die in a second direction which is perpendicular to the first direction, and the second part of the first protective structure is a second metal wall extending along the first side of the semiconductor bridge die in the second direction.

5. The semiconductor device of claim 1, wherein a width of the first part measured along the first direct is greater than a width of the second part measured along the first direction.

6. The semiconductor device of claim 1, wherein the fill material is an oxide.

7. The semiconductor device of claim 1, wherein the semiconductor device comprises a system on integrated chip.

8. The semiconductor device of claim 1, further comprising:
   a first electrically conductive bonding pad formed on the first side of the semiconductor bridge die;
   a second electrically conductive bonding pad formed on the first side of the semiconductor bridge die;
   a third electrically conductive bonding pad formed on the first side of the first semiconductor die; and
   a fourth electrically conductive bonding pad formed on the first side of the second semiconductor die;
   wherein the first and third electrically conductive bonding pads align and cooperate with one another to provide a first electrical interconnection between the first semiconductor die and the semiconductor bridge die, and the second and fourth electrically conductive bonding pads align and cooperate with one another to provide a second electrical interconnection between the second semiconductor die and the semiconductor bridge die.

9. A semiconductor integrated chip structure comprising:
   a first tier of dies including therein:
      a first die;
      a second die spaced apart from the first die; and
      a fill material disposed between the first and second dies, said fill material, first die and second die defining: (i) a first interface between the first die and the fill material; and (ii) a second interface between the second die and the fill material;
   a second tier of dies disposed on the first tier, the second tier including therein:
      a bridge die disposed to span the fill material, said bridge die at least partially overlapping the first die and at least partially overlapping the second die, said bridge die providing at least one electrical interconnection between the first and second dies;
   a first wall formed on a first side of the first tier of dies, said first wall spanning the first interface;
   a second wall formed on the first side of the first tier of dies, said second wall spanning the second interface;
   a third wall formed on a first side of the bridge die so as to face and align with the first wall; and
   a fourth wall formed on the first side of the bridge die so as to face and align with the second wall;
   wherein the first and third walls are in direct contact and physically merged together to create a first protective structure spanning the first interface and the second and fourth walls are in direct contact and physically merged together to create a second protective structure spanning the second interface.

10. The semiconductor integrated chip structure of claim 9, wherein:
   the first protective structure inhibits crack propagation into the bridge die from the first interface; and
   the second protective structure inhibits crack propagation into the bridge die from the second interface.

11. The semiconductor integrated chip structure of claim 9, wherein:

the first wall has a first width measured in a first direction, said first direction being transverse to a plane of the first interface;
   the second wall has a second width measure in the first direction;
   the third wall has a third width measured in the first direction;
   the fourth wall has a width measured in the first direction;
   the first width is greater than the third width; and
   the second width is greater than the fourth width.

12. The semiconductor integrated chip structure of claim 9, wherein the first, second, third and fourth walls are formed of metal.

13. The semiconductor integrated chip structure of claim 9, wherein the first and third walls are in direct contact and physically merged together and the second and fourth walls are merged together through metal-to-metal bonds and dielectric-to-dielectric bonds.

14. The semiconductor integrated chip structure of claim 13, wherein the fill material is an oxide.

15. A semiconductor device having a multi-tier construction of dies, said semiconductor device comprising:
   a first die and a second die in a first tier of the multi-tier construction with a gap therebetween, said first tier of the multi-tier construction having a first side;
   a fill material within the gap, the fill material forming an interface between the first die and the fill material;
   a first part of a protective structure on the first side of the first tier of the multi-tier construction, the first part of the protective structure spanning the interface; and
   a second part of the protective structure on a first side of a bridge die,
   wherein the bridge die is in a second tier of the multi-tier construction such that the first side of the bridge die faces the first side of the first tier of the multi-tier construction and the second part of the protective structure aligns with the first part of the protective structure, said bridge die providing an electrical interconnection between the first and second dies, and the first and second parts of the protective structure are physically joined together.

16. The semiconductor device of claim 15, wherein the first and second parts of the protective structure are physically joined to form a continuous protective structure.

17. The semiconductor device of claim 15, wherein the first and second parts of the protective structure are physically joined to form a continuous protective structure with one of a hybrid bond structure and a direct bond interconnect structure.

18. The semiconductor device of claim 15, wherein the first part of the protective structure includes a first channel on the first side of the first tier of the multi-tier construction such that the first channel spans the interface and the first channel is filled with a metal to create a first metal wall which spans the interface.

19. The semiconductor device of claim 15, wherein the first part of the protective structure includes a first channel on the first side of the first tier of the multi-tier construction such that the first channel spans the interface and the first channel is filled with a metal to create a first metal wall which spans the interface, and the second part of the protective structure includes a second channel on the first side of the bridge die and the second channel is filled with the metal to create a second metal wall.

20. The semiconductor device of claim 15, wherein the first and second parts of the protective structure are not electrically connected to electronic elements within the first die, second die or bridge die.

* * * * *